(12) United States Patent
Fischer et al.

(10) Patent No.: US 7,768,126 B2
(45) Date of Patent: Aug. 3, 2010

(54) BARRIER FORMATION AND STRUCTURE TO USE IN SEMICONDUCTOR DEVICES

(75) Inventors: Kevin Fischer, Hillsboro, OR (US); Vinay Chikarmane, Portland, OR (US); Brennan Peterson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 162 days.

(21) Appl. No.: 11/540,199

(22) Filed: Sep. 29, 2006

(65) Prior Publication Data

US 2008/0079165 A1 Apr. 3, 2008

(51) Int. Cl.
*H01L 23/48* (2006.01)

(52) U.S. Cl. .................... 257/751; 257/762

(58) Field of Classification Search .......... 257/759, 257/761–766, 751, 758, 750, 754, 756, 757
See application file for complete search history.

(56) References Cited

U.S. PATENT DOCUMENTS

| 6,281,121 | B1 * | 8/2001 | Brown et al. ............. 438/672 |
| 6,552,434 | B2 * | 4/2003 | Hasunuma et al. ........ 257/765 |
| 6,607,977 | B1 * | 8/2003 | Rozbicki et al. ......... 438/627 |
| 6,642,146 | B1 * | 11/2003 | Rozbicki et al. ......... 438/687 |
| 6,800,549 | B2 * | 10/2004 | Lee ......................... 438/628 |
| 2003/0073314 | A1 * | 4/2003 | Skinner et al. ........... 438/689 |
| 2003/0111735 | A1 * | 6/2003 | Lee ......................... 257/774 |

* cited by examiner

*Primary Examiner*—Wai-Sing Louie
*Assistant Examiner*—Bilkis Jahan
(74) *Attorney, Agent, or Firm*—Lee & Hayes, PLLC

(57) ABSTRACT

Embodiments of barriers to use in semiconductor devices are presented herein.

6 Claims, 8 Drawing Sheets

US 7,768,126 B2

BARRIER FORMATION AND STRUCTURE TO USE IN SEMICONDUCTOR DEVICES

BACKGROUND

Semiconductor devices, which may comprise microprocessors, flip chips, integrated circuits, central processing units, or the like, can be used to interconnect one or more devices or perform one or more operations. The technology of semiconductor devices is constantly improving. Decreasing the size of semiconductor devices may be one such way to improve their functionality. This may allow for more devices to fit in a given area and may increase a speed of the device. Tungsten has traditionally been used in contact regions of semiconductor devices, although Tungsten has a relatively high resistivity.

DETAILED DESCRIPTION

In the discussion that follows, specific implementation examples and methods are provided under the headings "Implementation Examples" and "Exemplary Methods". It is to be appreciated and understood that such implementation examples and exemplary methods are not to be used to limit application of the claimed subject matter to only these examples. Rather, changes and modifications can be made without departing from the spirit and scope of the claimed subject matter.

Implementation Examples

Figure 1:
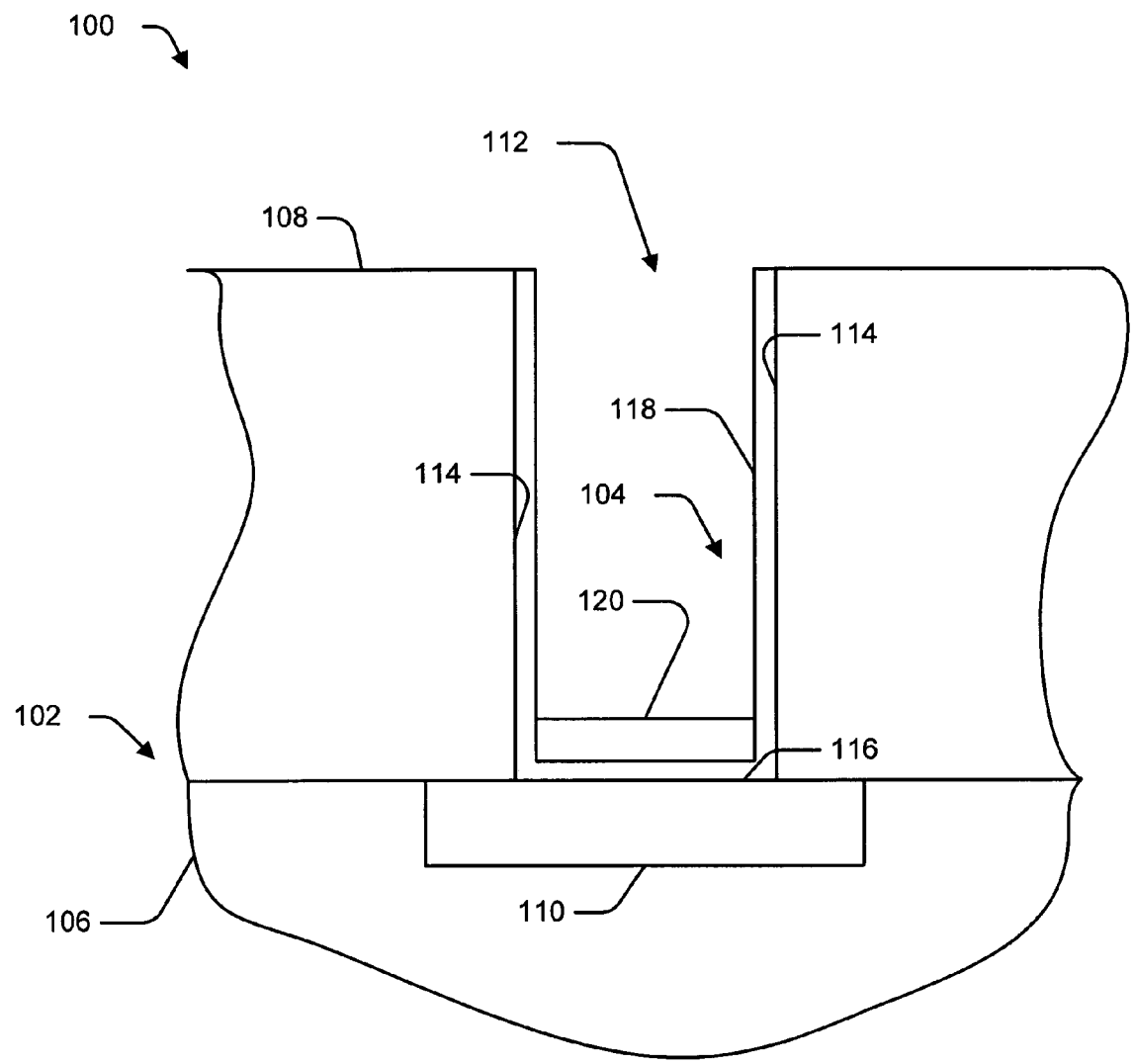
FIG. 1 is a diagrammatic side sectional view of a semiconductor device in accordance with an embodiment.

FIG. 1 depicts a semiconductor device 100 comprising a substrate 102 and a barrier layer 104. Semiconductor device 100 may comprise, without limitation, any number of devices, including a microprocessor, flip chip, transistor, central processing unit (CPU), or all or a portion of any electronic circuit, for example. Substrate 102 may comprise any suitable type of material in which a feature may be formed, as described below. Substrate 102 may also comprise a semiconductor layer 106, which may comprise any number of semiconductor materials. For example, silicon may comprise, either in whole or in part, semiconductor layer 106. Substrate 102 may further comprise an insulating layer 108, which may be comprised of any suitable insulating material(s). Examples of such suitable insulating materials may include many oxide or nitride materials. Silicon oxide may, in one example, comprise insulating layer 108.

Semiconductor device 100 may further include an area 110 with which an electrical connection is desired. Area 110 may comprise all or a portion of a transistor device in some implementations. In one example, area 110 may comprise one or more terminals of a transistor, such as a source, drain, and/or gate terminal(s). Area 110 may be located within semiconductor layer 106, either in whole or in part.

As depicted in FIG. 1, substrate 102 may further define a feature which is depicted as a trench 112 which may provide a contact to area 110, although a variety of other features are also contemplated. Area 110 may situate underneath all or only a portion of trench 112. Although trench 112 may be formed in any portion of semiconductor device 100, here it is shown to be formed in insulating layer 108. Trench 112 may define a side 114 and a bottom 116. As depicted in later figures, side 114 and bottom 116 may have varying geometries and/or topographies. Trench 112 may be formed in any suitable way. For example, masked etching may be used.

As discussed above, semiconductor device may include barrier layer 104. Barrier layer 104 may function in some embodiments to line, coat, or cover all or a portion of trench 112. If any material is located within trench 112, as discussed below, then barrier layer 104 may also function to contain this material within the trench. In some embodiments, barrier layer 104 may serve to separate the material located in trench 112 from substrate 102. In some instances, it may more specifically serve to separate the material from semiconductor layer 106, insulating layer 108, and/or area 110. While not illustrated, it will be appreciated that semiconductor device 100 may comprise other layers or regions. For example, trench 112 may include one or more salicide and/or oxide layer(s).

In some implementations, barrier layer 104 may comprise a plurality of layers. FIG. 1 depicts a barrier laser that comprises at least two discrete layers. As shown, barrier layer 104 includes a layer 118 that substantially conforms to the substrate and/or trench and a layer 120 that does not so conform. Conforming layer 118 may substantially cover side 114 and bottom of trench 112. Furthermore, conforming layer 118 may, in some instances, consist of a substantially uniform thickness throughout the layer. Non-conforming layer 120, meanwhile, might not cover the entire trench 112 as defined by substrate 102. Instead, non-conforming layer 120 might only cover a portion of the trench 112. In the illustrated and non-limiting example, non-conforming layer 120 substantially covers bottom 116 of trench 112 but not side 114. Additionally, non-conforming layer 120 may substantially or even entirely cover the bottom of the trench, or it may only cover a portion of the bottom 116. Furthermore, it should be noted that non-conforming layer 120 may reside directly adjacent to bottom 116, or it may reside near bottom 116 with other layers separating it from bottom 116. As shown, conforming layer 118 may be placed in between non-conforming layer 120 and bottom 116, although in another implementation the orders may be reversed, e.g., non-conforming layer 120 may reside nearer bottom 116 of trench 112 than conforming layer 118, further discussion of which may be found in relation to FIG. 3.

If multiple layers are used, as depicted in FIG. 1 and discussed above, the resulting barrier layer 104 may comprise a portion on side 114 that is thinner than a portion located on bottom 116. In other words, the portion of barrier layer 104 near bottom 116 of trench 112 may be thicker than the portion of barrier layer 104 on side 114, which may result in a more robust barrier near bottom 116 of trench 112. Furthermore, the resulting barrier layer 104 may not only be robust near bottom 116, but it may also result in a thin sidewall thickness, thus enlarging the volume of trench 112. As such, non-conforming layer 120 may be thicker than conforming layer 118. In some instances, it may be substantially thicker.

Conforming layer 118 may comprise any material that is suitable for creating a barrier between trench 112 and substrate 102. Furthermore, any such material may be formed by any suitable method(s), with chemical vapor deposition (CVD), atomic layer deposition (ALD), plasma vapor deposition (PVD), and sputtering sufficing as but four non-limiting examples. In some implementations, conforming layer 118 may comprise multiple materials, such as a metal and/or a metal nitride. In one example, conforming layer 118 may comprise titanium and/or titanium nitride. In another example, conforming layer 118 may comprise tantalum and/or tantalum nitride.

In some implementations, conforming layer 118 may be formed in trench 112 before non-conforming layer 120. As discussed above, conforming layer 118 may be formed by CVD, PVD and/or ALD methods, among others. It should also be noted that conforming layer 118 itself may be formed in a single layer or in a plurality of layers. For example, a metal such as titanium may first be deposited via PVD. This may function to "getter" a top surface of semiconductor layer 106. If semiconductor layer 106 comprises silicon, then deposition of the metal such as titanium may serve to remove any silicon dioxide, which may in turn provide a low resistance and good contact between barrier layer 104 and substrate 102. In this example, a metal nitride may then be deposited by any method, with CVD serving as but one example. If CVD is used, it may serve to cover geometries and/or topographies that other methods, such as PVD, may otherwise be unable to cover. This resulting layer of metal nitride, which may comprise titanium nitride for example, may serve to complete con-forming layer 118. It is noted, however, that it may also be but one of many layers, or it may serve to create conforming layer 118 completely on its own. Conforming layer 118 may comprise an amorphous barrier which substantially covers the surfaces (e.g., bottom 116 and side 114) of trench 112.

Non-conforming layer 120 may also comprise any material that is suitable for creating a barrier between trench 112 and substrate 102. Furthermore, any such material may be formed by any suitable method, with CVD, ALD, PVD and/or sputtering sufficing as but four non-limiting examples. In some implementations, non-conforming layer 120 may comprise multiple materials, such as a metal and/or a metal nitride. In one example, non-conforming layer 120 may comprise tantalum and/or tantalum nitride.

In some implementations, non-conforming layer 120 may be formed in trench 112 after conforming layer 118 has been formed. It should also be noted that non-conforming layer 120 itself may be formed in a single layer or in a plurality of layers. For example, non-conforming layer 120 may be formed by sputtering or by a PVD method in order to deposit tantalum and/or tantalum nitride into trench 112. Tantalum and/or tantalum nitride may suffice in some instances to provide for a good wetting surface for a material, such as copper, which may be placed in trench 112. Having a good wetting surface may be important when forming such material in trench 112, as it may serve to avoid creating voids in such material during deposition. This is described in more detail with reference to FIG. 4.

The resulting non-conforming layer 120 may result in a robust barrier at bottom 116 of trench 112, while not serving to thicken side 114. If side 114 is not thickened with barrier layer 104, then the resulting volume in trench 112 may be maximized while still providing a robust barrier. It is noted, however, that in some implementations the thicknesses of the conforming and non-conforming layers could be roughly equal, or conforming layer 118 could be thicker than non-conforming layer 120. Note finally that in some implementations, the above-described deposition of non-conforming layer 120 may be deemed non-isotropic.

Figure 2:
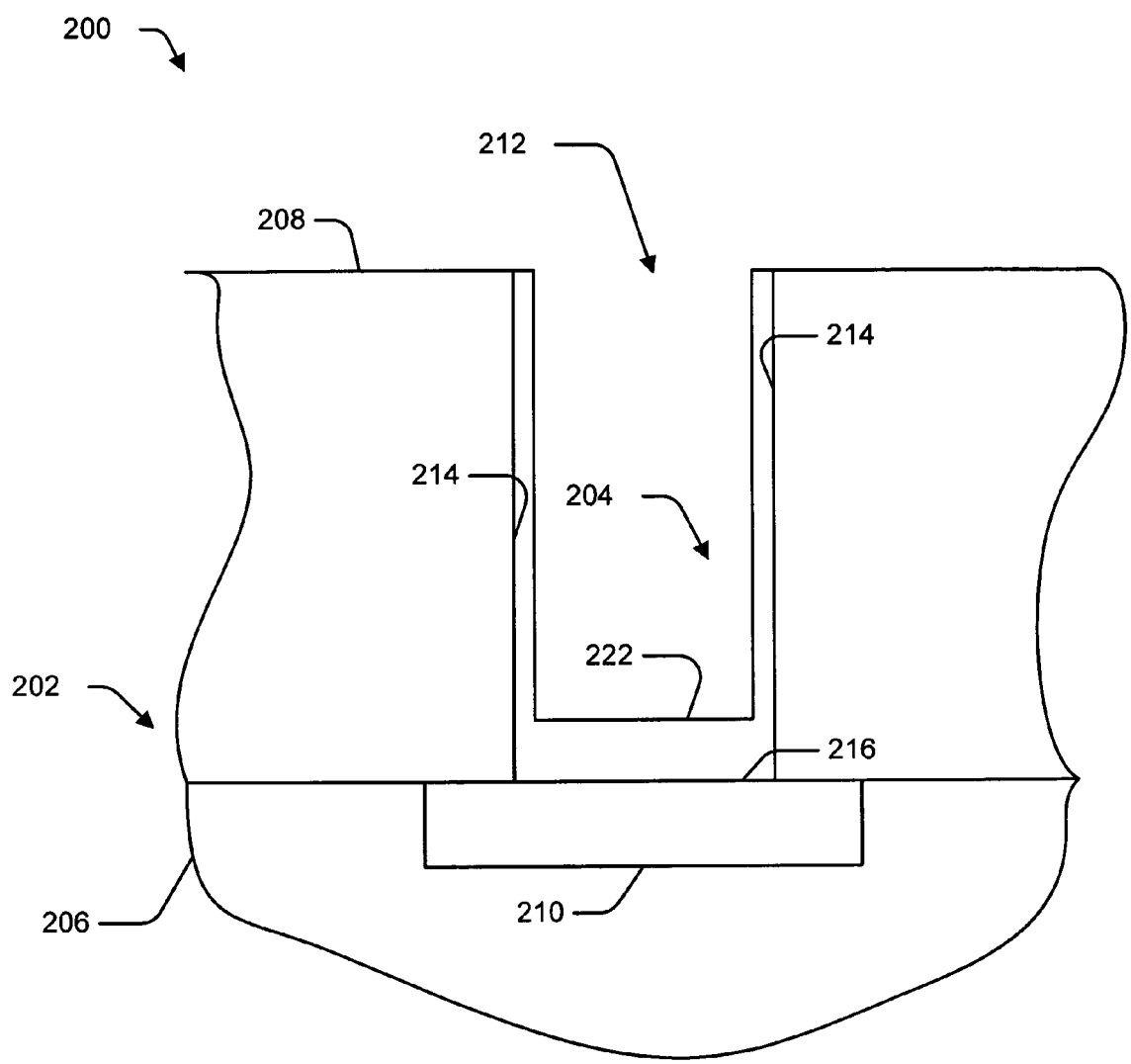
FIG. 2 is a diagrammatic side sectional view of a semiconductor device in accordance with an embodiment.

Reference is now made to FIG. 2, which depicts a semiconductor device 200. Semiconductor device 200 may comprise a substrate 202 and a barrier layer 204. Substrate 202 may comprise a semiconductor layer 206, an insulating layer 208, and an area 210 with which electrical connection is desired. Substrate 202 may further define a feature, which is depicted as trench 212. Trench 212 may comprise a side 214 and a bottom 216. It is noted, however that other embodiments of features are also envisioned.

Barrier layer 204 may or may not serve similar functions as described above in regards to barrier layer 104. In this example, however, barrier layer 204 may comprise a single layer 222. Layer 222 may or may not comprise many of the characteristics described above in regards to conforming layer 118 and non-conforming layer 120. For example, layer 222 may comprise a multitude of different materials, such as a metal and/or a metal nitride. Although layer 222 may comprise a single layer, it may be thicker near bottom 216 of trench 212 than on side 214. In some embodiments, it may be substantially thicker.

Figure 3:
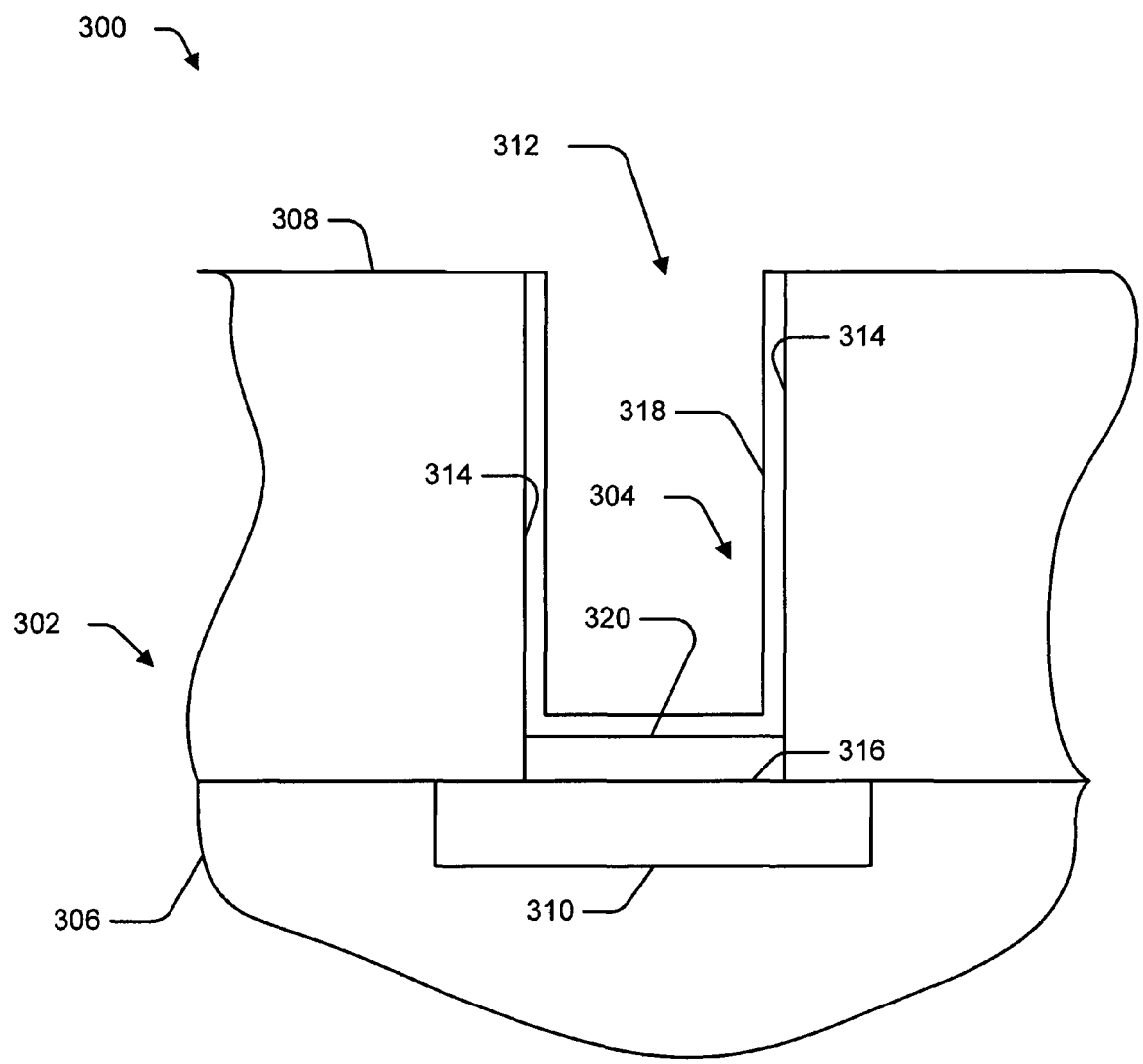
FIG. 3 is a diagrammatic side sectional view of a semiconductor device in accordance with an embodiment.

Reference is now made to FIG. 3, which depicts a semiconductor device 300. Semiconductor device 300 may comprise a substrate 302 and a barrier layer 304. Substrate 302 may comprise a semiconductor layer 306, an insulating layer 308, and an area 310 with which electrical connection is desired. Substrate 302 may further define a feature, which here is depicted as trench 312. Trench 312 may comprise a side 314 and a bottom 316. It is noted, however that other embodiments of features are also envisioned.

Barrier layer 304 may or may not serve similar functions as described above in regards to barrier layer 104. In this example, barrier layer 304 may comprise a first layer 320 and a second layer 318. First layer 320 and second layer 318 may or may not comprise many of the characteristics described above in regards to conforming layer 118 and non-conforming layer 120. For example, both first layer 320 and second layer 318 may comprise a multitude of different materials, such as a metal and/or a metal nitride.

In this example, however, first layer 320 may be non-conforming with regards to trench 312. In other words, first layer 320 may be formed before second layer 318, with first layer 320 covering a portion of trench 312. In this example, first layer 320 may cover all or a portion of bottom 316. Next, second layer 318 may be formed, possibly on top of first layer 320, although other layer(s) could exist there between. Second layer 318 may conform to trench 312. In other words, second layer 318 may cover all or substantially all of trench 312. If second layer 318 is formed after first layer 320, then second layer 318 may cover all or substantially all of a portion of first layer 320 located near bottom 316 of trench 312. As depicted in FIG. 3, first layer 320 may be thicker—possibly substantially thicker—than second layer 318. It is noted, however, that is some implementations the thicknesses could be roughly equal, or second layer 318 could be thicker than first layer 320.

Figure 4:
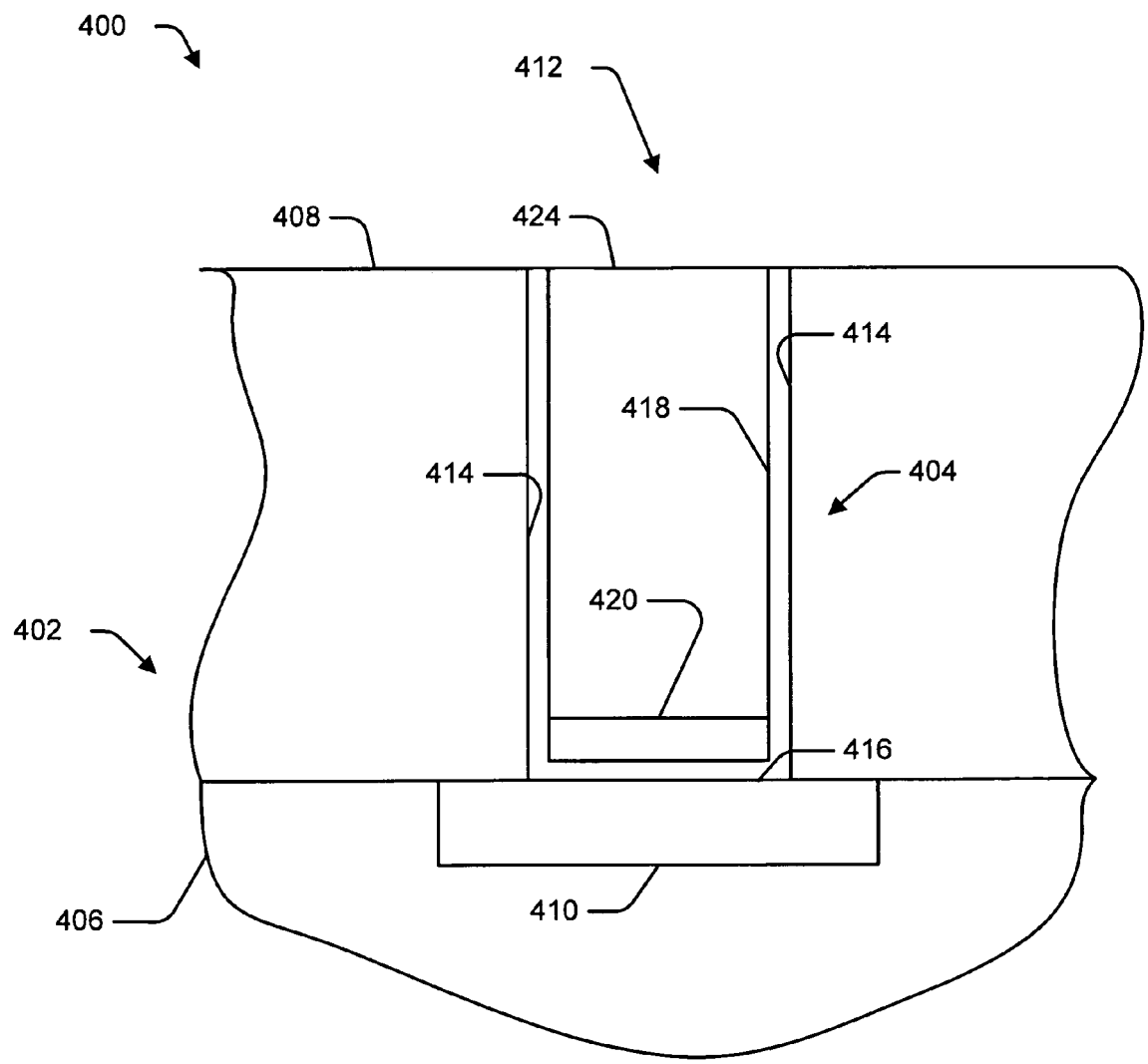
FIG. 4 is a diagrammatic side sectional view of a semiconductor device including a contact layer in accordance with an embodiment.

Referring to FIG. 4, a semiconductor device 400 may comprise a substrate 402 and a barrier layer 404. Substrate 402 may comprise a semiconductor layer 406, an insulating layer 408, and an area 410 with which electrical connection is desired. Substrate 402 may further define a feature, which is here depicted as trench 412. Trench 412 may comprise a side 414 and a bottom 416. It is noted, however, that other embodiments of features are also envisioned.

Semiconductor device 400, however, may further comprise a contact layer 424. Contact layer 424 may be located partially or completely within trench 412. Contact layer 424 may, for example, serve to connect backend metallurgy to area 410 and/or semiconductor layer 406. In some implementations, contact layer 424 may comprise a plug and/or one or more contact line(s).

Contact layer 424 may comprise numerous forms of material, such as different types of metal. Specific metals that may be used include copper and tungsten. If copper is used in contact layer 424, a robust barrier may be used to contain the copper in trench 412, as the copper may react with substrate 402 and/or semiconductor layer 406. In some embodiments, copper may be used for contact layer 424, silicon may be used for semiconductor layer 406, and silicon oxide or the like may be used for insulating layer 408. In these examples, copper may be more prone to reaction with the silicon than with the silicon oxide. If a reaction between the copper and silicon is allowed to occur, for instance, copper silicide may be formed. This may compromise qualities of semiconductor device 400 and/or semiconductor layer 406. In fact, such a reaction may cause all or a portion of semiconductor layer 406 to become conductive, which may short electrical connections that are contacted by the conductive material. Thus, in these examples, a robust barrier may be used at bottom 416 of trench 412 to contain the copper within trench 412.

Barrier layer 404 may thus comprise many of the same qualities described above in regards to barrier layer 104. For instance, barrier layer 404 may comprise a conforming layer 418 and a non-conforming layer 420. These layers may or may not have many of the same qualities described above in regards to conforming layer 118 and non-conforming layer 120. For example, conforming layer 418 may be thinner than non-conforming layer 420. Furthermore, in the non-limiting illustrated example, conforming layer 418 may cover all or substantially all of trench 412, while non-conforming layer 420 may be located substantially near a bottom 416 of trench 412. This may result in a robust barrier at the bottom 416 of trench 412; where the copper may otherwise react with the silicon in semiconductor layer 406. This may also maintain a thin barrier on side 414, where the copper may not react with the silicon oxide in insulating layer 408. In this example, the volume of trench 412 may be maximized to allow for maximum amounts of copper, while the thin barrier on side 414 may also provide for a low line resistance in trench 412. Thus, this example may provide for a robust barrier while sacrificing only a relatively small amount of trench volume.

In the example where copper comprises contact layer 424, the copper may be formed in any suitable manner. In one non-limiting example, a seed layer of copper may first be placed near bottom 416 of trench 412. This seed layer may be formed in any suitable manner, with sputtering being but one non-limiting example. Non-conforming layer 420 may comprise tantalum and/or tantalum nitride, as described above in regards to non-conforming layer 120. Either or both may provide a good wetting surface for the seed layer of copper. It may be important that non-conforming layer 420 provide such a wetting surface, so that the copper does not agglomerate during the formation of the seed layer and/or during the formation of the remainder of the copper. In this example, the remaining copper may then be formed by an electroplating method. If the seed layer does not completely or substantially cover the portion of barrier layer 404 near bottom 416 (e.g. the copper agglomerates), then such electroplating may result in undesired voids in the copper contact layer.

In this example, once copper is placed trench 412, the described barrier layer 404 may provide a robust barrier so as to contain the copper within the trench while still realizing a desired volume for the copper contact layer.

Figure 5:
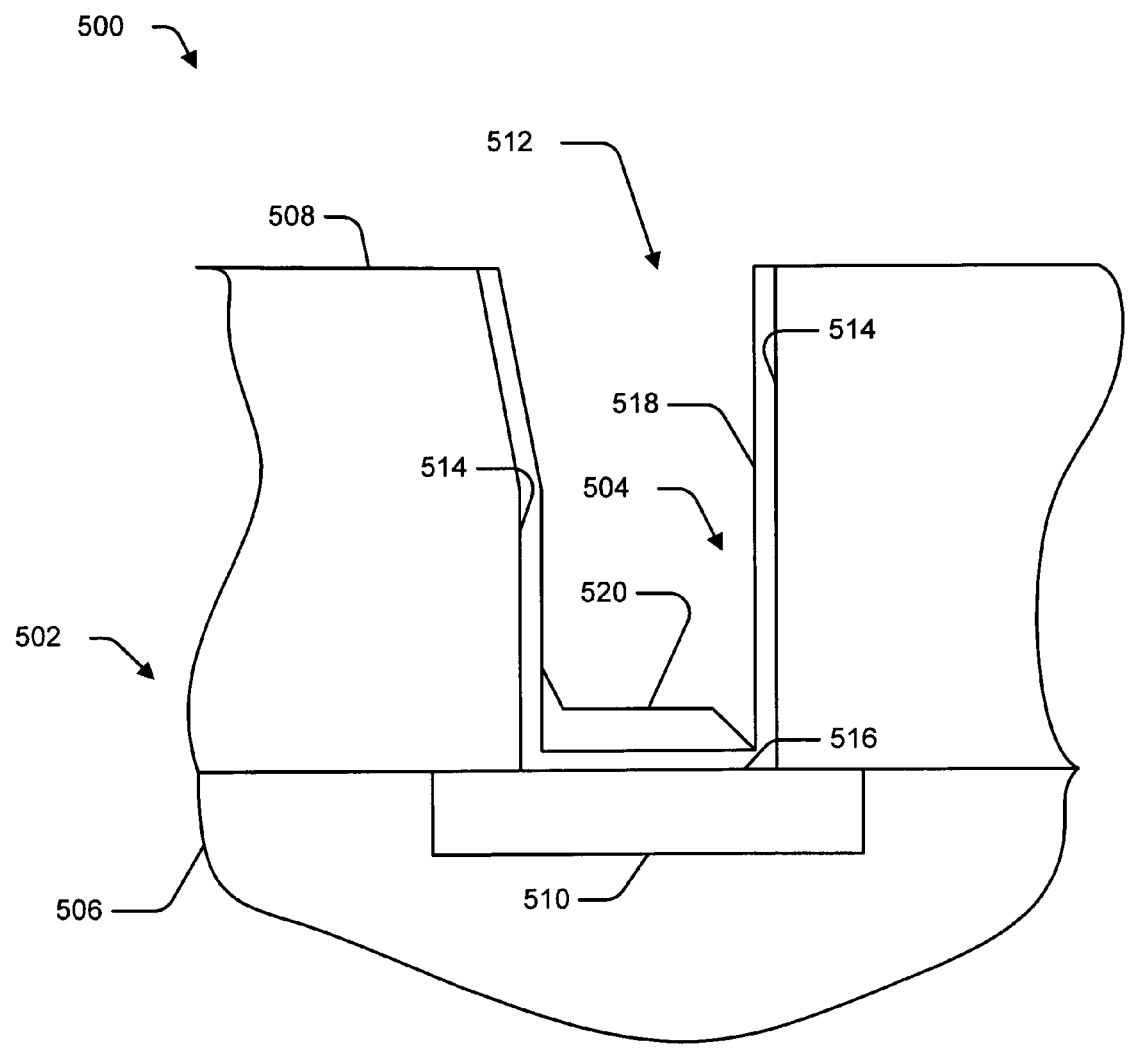
FIG. 5 is a diagrammatic side sectional view of a semiconductor device in accordance with an embodiment.
Figure 6:
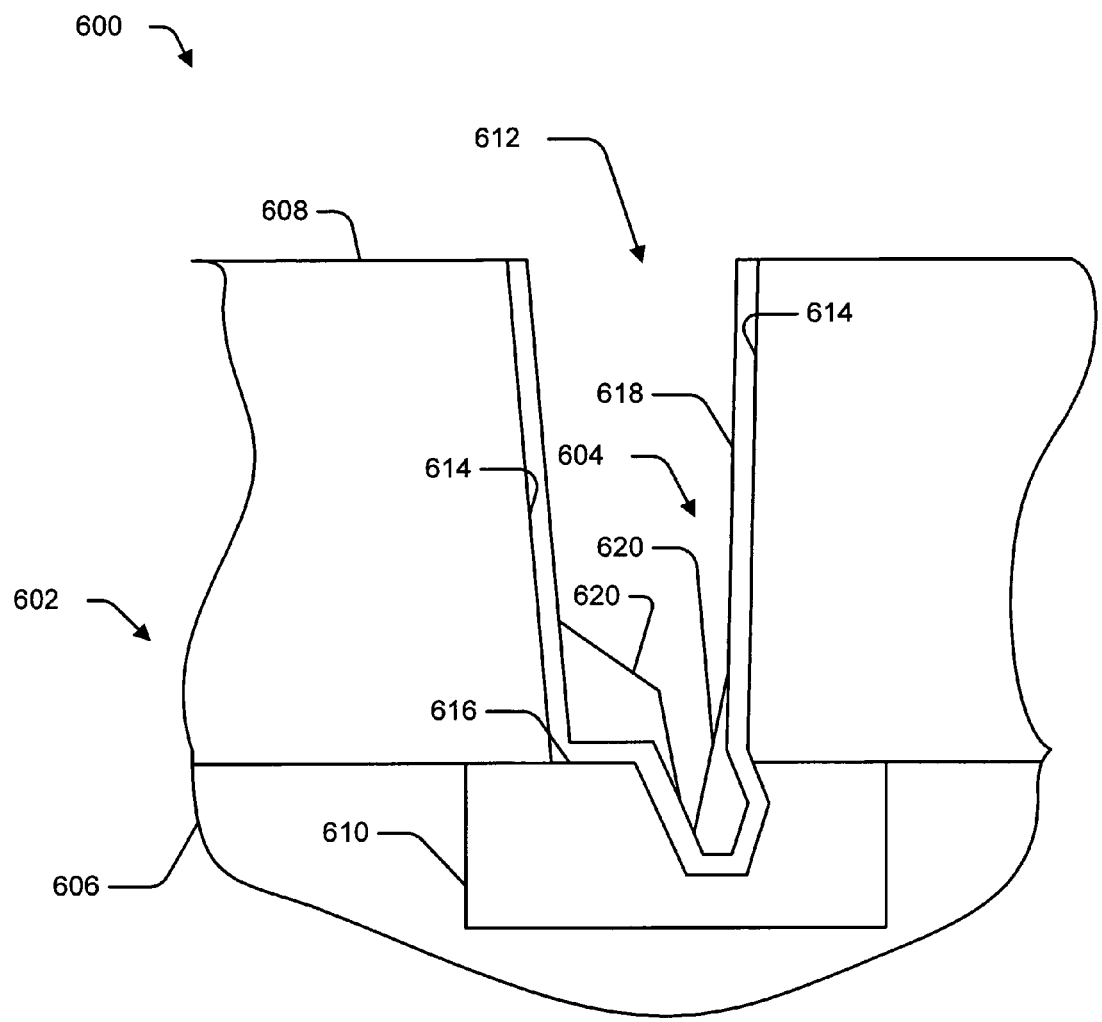
FIG. 6 is a diagrammatic side sectional view of a semiconductor device in accordance with an embodiment.

FIGS. 5 and 6 depict trenches having varying geometries and/or topographies, both as to sides and bottoms. The embodiments described above may serve to allow for a robust barrier and to maximize trench volume in these trenches of varying geometry. FIG. 5, for example, depicts a semiconductor device 500. Semiconductor device 500 may comprise a substrate 502 and a barrier layer 504. Substrate 502 may comprise a semiconductor layer 506, an insulating layer 508, and an area 510 with which electrical connection is desired. Substrate 502 may further define a feature, which is here depicted as trench 512. Trench 512 may comprise a side 514 and a bottom 516. It is noted, however, that other embodiments of features are also envisioned.

Barrier layer 504 may or may not serve similar functions as described above in regards to barrier layer 104. In this example, barrier layer 504 may comprise a conforming layer 518 and a non-conforming layer 520. Conforming layer 518 and non-conforming layer 520 may or may not comprise many of the characteristics described above in regards to conforming layer 118 and non-conforming layer 120. For example, both conforming layer 518 and non-conforming layer 520 may comprise a multitude of different materials, such as a metal and/or a metal nitride.

In this example, however, side 514 of trench 512 may be non-uniform. This may result in a larger portion of non-conforming layer 520 covering a portion of side 514 than previously shown in FIG. 1. Nevertheless, as FIG. 5 depicts, conforming layer 518 may substantially cover the entire trench 512, while non-conforming layer 520 may substantially cover bottom 516 and possibly some amount of side 514.

FIG. 6 depicts a semiconductor device 600. Semiconductor device 600 may comprise a substrate 602 and a barrier layer 604. Substrate 602 may comprise a semiconductor layer 606, an insulating layer 608, and an area 610 with which electrical connection is desired. Substrate 602 may further define a feature, which is here depicted as trench 612. Trench 612 may comprise a side 614 and a bottom 616. It is noted, however, that other embodiments of features are also envisioned.

Barrier layer 604 may or may not serve similar functions as described above in regards to barrier layer 104. In this example, barrier layer 604 may comprise a conforming layer 618 and a non-conforming layer 620. Conforming layer 618 and non-conforming layer 620 may or may not comprise many of the characteristics described above in regards to conforming layer 118 and non-conforming layer 120. For example, both conforming layer 618 and non-conforming layer 620 may comprise a multitude of different materials, such as a metal and/or a metal nitride.

In this example, however, side 614 of trench 612 may be non-uniform at both side 614 and bottom 616. This may result in a larger portion of non-conforming layer 620 covering a portion of side 614. This non-uniformity may also result in a portion of bottom 616 that is not covered by non-conforming layer 620. Nevertheless, as FIG. 6 depicts, conforming layer 618 may substantially cover the entire trench 612, while non-conforming layer 620 may substantially cover bottom 616 and a lesser amount of side 614.

In the specific examples illustrated above, barrier layers have been shown to comprise multiple different layers that are formed at different times. Each of the layers may be formed to overlie portions of the trench side and bottom. It is possible, however, to have a barrier layer architecture that is different from that specifically described above without departing from the spirit and scope of the claimed subject matter. For example, some barrier layer architectures might be designed to provide only a negligible amount of a barrier layer material, if any, over the side of the trench.

Exemplary Methods

Figure 7:
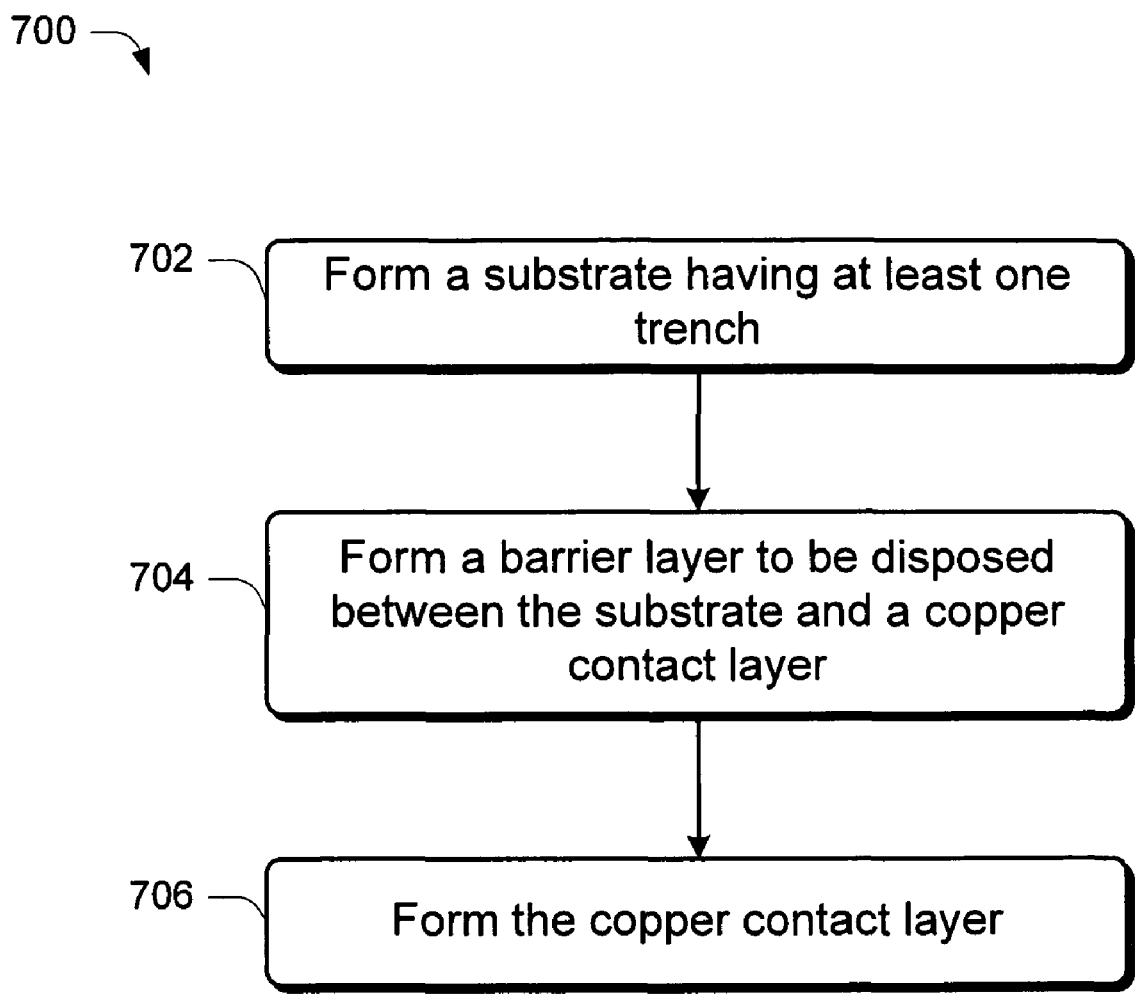
FIG. 7 is a flow diagram that illustrates acts in accordance with an embodiment.

FIG. 7 is a flow diagram that illustrates one non-limiting exemplary method 700 in accordance with one embodiment described herein. Act 702 may comprise forming a substrate having at least one trench. Any suitable techniques can be utilized to form the substrate and trench. Act 704 may comprise forming a barrier layer to be disposed between the substrate and a copper contact layer. Any suitable techniques can be utilized to form the barrier layer, non-limiting examples of which are given above. For example, forming the barrier layer may comprise forming a conformal layer and a non-conformal layer. Act 706 may comprise forming a contact layer, which may utilize copper. Any suitable techniques can be utilized to form the contact layer, non-limiting examples of which are given above. For example, a seed layer of copper may first be formed before the remaining copper is formed using electroplating techniques.

Exemplary System

Figure 8:
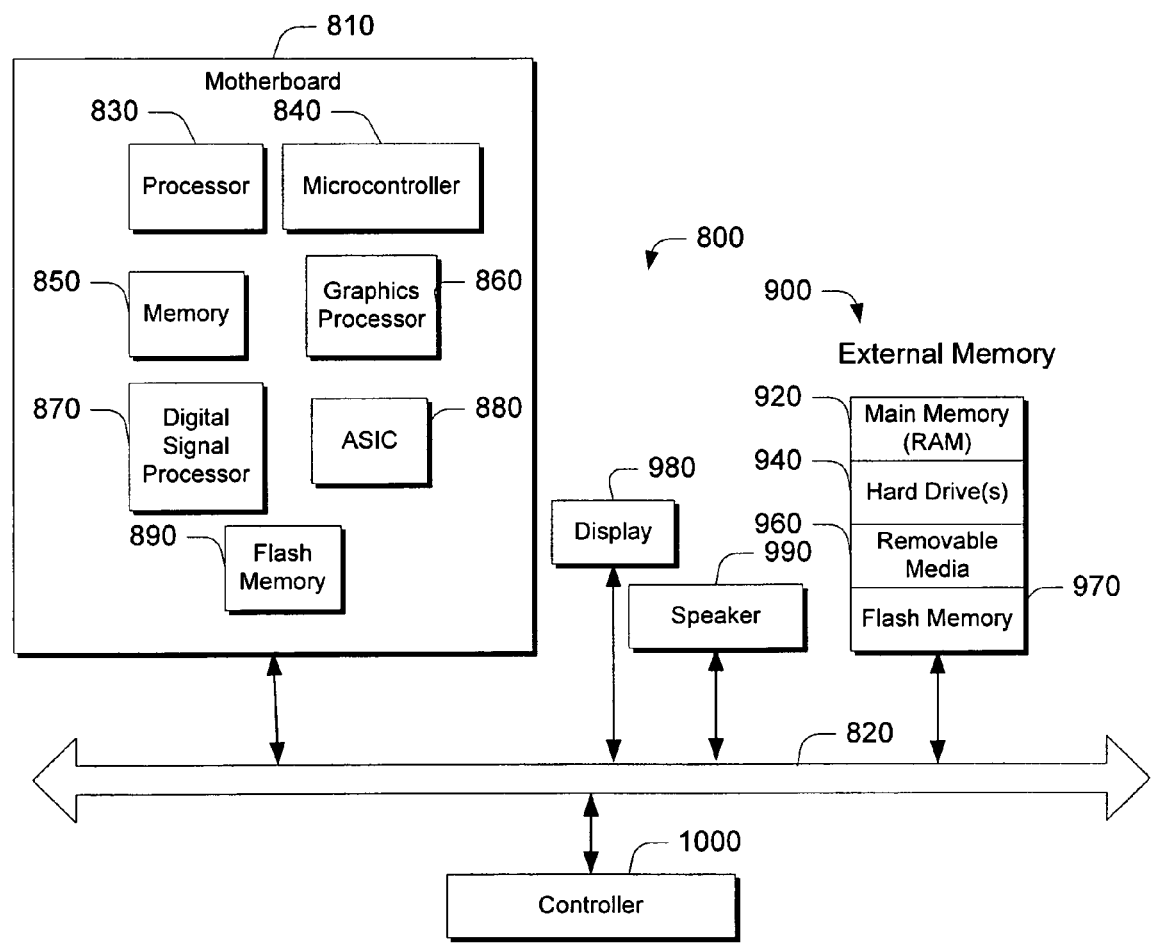
FIG. 8 is a diagram that illustrates an exemplary system in which semiconductor devices formed in accordance with the embodiments described herein can be used, in accordance with an embodiment.

FIG. 8 depicts a block diagram of an exemplary electronic system 800 that may include semiconductor devices, such as those described above. Such electronic system 800 may comprise a computer system that includes a motherboard 810 which is electrically coupled to various components in electronic system 800 via a system bus 820. System bus 820 may be a single bus or any combination of busses.

Motherboard 810 can include, among other components, one or more processors 830, a microcontroller 840, memory 850, a graphics processor 860 or a digital signal processor 870, and/or a custom circuit or an application-specific integrated circuit 880, such as a communications circuit for use in wireless devices such as cellular telephones, pagers, portable computers, two-way radios, and similar electronic systems and a flash memory device 890.

Electronic system 800 may also include an external memory 900 that in turn may include one or more memory elements suitable to the particular application. This may include a main memory 920 in the form of random access memory (RAM), one or more hard drives 940, and/or one or more drives that handle removable media 960, such as floppy diskettes, compact disks (CDs) and digital video disks (DVDs). In addition, such external memory may also include a flash memory device 970.

Electronic system 800 may also include a display device 980, a speaker and a controller 1000, such as a keyboard, mouse, trackball, game controller, hone, voice-recognition device, or any other device that inputs information electronic system 800.

CONCLUSION

In the embodiments described above, a semiconductor device with a robust barrier is provided. The barrier may include different materials and geometries that are selected to be employed in connection with a contact layer, which may be formed of copper. Some of the barrier material may be formed over substantially the entire trench, while some of the barrier material is formed only over a trench bottom. The material over substantially the entire trench and the material over only the trench bottom may comprise the same or different materials. These materials may be formed using techniques as described above, and the techniques for different barrier layers may be the same or different.

By selecting the appropriate barrier layer geometries, materials and forming techniques, diffusion between the contact layer and the substrate can be avoided while still maintaining a relatively large trench volume for the contact layer.

Although the embodiments have been described in language specific to structural features and/or methodological acts, it is to be understood that the subject matter defined in the appended claims is not necessarily limited to the specific features or acts described. Rather specific features and acts are disclosed as exemplary forms of implementing the claimed subject matter.

What is claimed is:

1. An apparatus comprising:
a substrate defining a trench with a left side portion, a right side portion and a bottom portion, the trench formed through: 1) the substrate, and 2) an area where electrical connection is desired;
a copper contact at least partially located in the trench; and
a barrier disposed between the substrate and the copper contact, the barrier substantially layering the trench, wherein the barrier comprises at least two layers, the at least two layers include first and second layers, and
wherein the first layer substantially covers the left and right side portions of the trench and the bottom portion of the trench and the second layer substantially covers the bottom portion of the trench and covers a larger portion of the left side portion than the right side portion of the trench, wherein the second layer does not cover a portion of the bottom portion of the trench, and wherein a first shape of the left side portion of the second layer is a different shape than a second shape of the right side portion of the second layer, and wherein the two layers comprise different materials.

2. An apparatus as described in claim 1, wherein: the second layer does not conform to the trench.

3. An apparatus as described in claim 2, wherein the non-conforming second layer is thicker than the conforming first layer.

4. An apparatus as described in claim 1, wherein a first said layer substantially conforms to the trench and a second said layer comprises a non-isotropic deposition.

5. An apparatus as described in 1, wherein the first layer is formed at least in part by atomic layer deposition (ALD).

6. A method as described in claim 1, wherein the first layer is formed at least in part by atomic layer deposition (ALD) and the second layer is formed at least in part by plasma vapor deposition (PVD).

* * * * *